US008536556B2

(12) United States Patent
Fukumizu (10) Patent No.: US 8,536,556 B2
(45) Date of Patent: Sep. 17, 2013

(54) NONVOLATILE MEMORY DEVICE AND METHOD FOR MANUFACTURING NONVOLATILE MEMORY DEVICE

(75) Inventor: Hiroyuki Fukumizu, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 351 days.

(21) Appl. No.: 12/726,794

(22) Filed: Mar. 18, 2010

(65) Prior Publication Data

US 2010/0243980 A1    Sep. 30, 2010

(30) Foreign Application Priority Data

Mar. 25, 2009   (JP) .................................. 2009-75113

(51) Int. Cl.
*H01L 47/00*   (2006.01)
(52) U.S. Cl.
USPC ........................................ 257/4; 257/2; 257/5
(58) Field of Classification Search
USPC ........................... 257/2–5, E31.001, E31.027
See application file for complete search history.

(56) References Cited

U.S. PATENT DOCUMENTS 7,906,392 B2 *   3/2011   Dunton et al. ................ 438/239

FOREIGN PATENT DOCUMENTS

| JP | 2005-522045 | 7/2005 |
|---|---|---|
| JP | 2006-140491 | 6/2006 |
| JP | 2007-149170 | 6/2007 |
| JP | 2008-235637 | 10/2008 |
| JP | 2009-130138 | 6/2009 |
| JP | 2009-135131 | 6/2009 |
| WO | WO 2008/047530 A1 | 4/2008 |

OTHER PUBLICATIONS

Japanese Office Action issued May 6, 2011, in Patent Application No. 2009-075113 (with English-language translation).

* cited by examiner

*Primary Examiner* — Hung Vu
(74) *Attorney, Agent, or Firm* — Oblon, Spivak, McClelland, Maier & Neustadt, L.L.P.

(57) ABSTRACT

A nonvolatile memory device includes: a first interconnection extending in a first direction; a second interconnection extending in a second direction nonparallel to the first direction; and a memory layer placed between the first interconnection and the second interconnection and reversibly transitioning between a first state and a second state by a current supplied via the first interconnection and the second interconnection. A cross section parallel to the first and the second direction of the memory layer decreases toward the second interconnection.

3 Claims, 11 Drawing Sheets

NONVOLATILE MEMORY DEVICE AND METHOD FOR MANUFACTURING NONVOLATILE MEMORY DEVICE

CROSS-REFERENCE TO RELATED APPLICATIONS

This application is based upon and claims the benefit of priority from the prior Japanese Patent Application No. 2009-075113, filed on Mar. 25, 2009; the entire contents of which are incorporated herein by reference.

BACKGROUND

1. Field

Embodiments of the invention relate generally to a nonvolatile memory device and a method for manufacturing a nonvolatile memory device.

2. Background Art

A NAND nonvolatile memory device using a transistor faces a difficulty in device operations due to what is called "short channel effects" accompanying the miniaturization of the device. The "short channel effects" are phenomena that occur due to a short distance between the source portion and the drain portion caused by the miniaturization of the device, such as an increased leak current between the source and the drain. Therefore, the development of memory devices that take the place of the memory device using a transistor is desirable. As one of those devices, a nonvolatile memory device (resistance change memory, ReRAM) is investigated that utilizes the property that applying an electric field pulse to a transition metal insulating film and the like changes the resistance of the substance (refer to JP-A 2007-149170 (Kokai), for example).

Currently, a crosspoint nonvolatile memory device (resistance change memory) is investigated in which a memory layer is disposed at the intersection of a bit line and a word line. Such a device is allowed to have theoretically a cell area of $4F^2$ (where "F" is the design rule (the minimum design dimension)), which is equal to that of the NAND nonvolatile memory device. Furthermore, the nonvolatile memory device (resistance change memory) of such a configuration has also the advantage that the integration degree can be further improved by stacking a large number of stacked bodies that include memory layers.

Here, if the cross-sectional dimension of the memory layer in the direction substantially perpendicular to the stack direction varies between stacked layers, switching characteristics may vary between the layers. Therefore, a stacked body having a rectangular parallelepiped shape is formed so that components (e.g. a memory layer, a rectifying element, etc.) of the stacked body may have an equal cross-sectional dimension (refer to FIG. 12 and FIG. 13 of JP-A 2007-149170 (Kokai), for example).

In this case, for example, in order to achieve low power, the memory layer preferably has a small cross-sectional dimension in the direction substantially perpendicular to the stack direction. On the other hand, in order to reduce the load of the rectifying element, the rectifying element preferably has a large cross-sectional dimension in the direction substantially perpendicular to the stack direction.

Therefore, if the stacked body is configured to have a uniform cross-sectional dimension in the direction substantially perpendicular to the stack direction, future improvements may be difficult in electrical characteristics of the nonvolatile memory device (resistance change memory, ReRAM).

SUMMARY

According to an aspect of the invention, there is provided a nonvolatile memory device including: a first interconnection extending in a first direction; a second interconnection extending in a second direction nonparallel to the first direction; and a memory layer placed between the first interconnection and the second interconnection and reversibly transitioning between a first state and a second state by a current supplied via the first interconnection and the second interconnection, a cross section parallel to the first and the second direction of the memory layer decreasing toward the second interconnection.

According to another aspect of the invention, there is provided a method for manufacturing a nonvolatile memory device, the device including memory cells stacked in a plurality of layers, each of the memory cells including: a first interconnection extending in a first direction; a second interconnection extending in a second direction nonparallel to the first direction; and a memory layer placed between the first interconnection and the second interconnection and reversibly transitioning between a first state and a second state by a current supplied via the first interconnection and the second interconnection, the method including: stacking a layer being to form the first interconnection, a layer being to form the memory layer, and a layer being to form the second interconnection in a third direction substantially perpendicular to the first direction and the second direction to form a stacked body; providing an etching mask having an opening on the stacked body; and forming an element isolation region by etching the stacked body via the etching mask, and an opening dimension of the etching mask being decreased with an increasing dimension in the third direction of the element isolation region in the providing the etching mask.

According to another aspect of the invention, there is provided a method for manufacturing a nonvolatile memory device, the device including memory cells stacked in a plurality of layers, each of the memory cells including: a first interconnection extending in a first direction; a second interconnection extending in a second direction nonparallel to the first direction; and a memory layer placed between the first interconnection and the second interconnection and reversibly transitioning between a first state and a second state by a current supplied through the first interconnection and the second interconnection, the method including: stacking a layer being to form the first interconnection, a layer being to form the memory layer, and a layer being to form the second interconnection in a third direction substantially perpendicular to the first direction and the second direction to form a stacked body; providing an etching mask having an opening on the stacked body; performing etching of a smaller dimension than a dimension in the third direction of an element isolation region in the third direction using the etching mask; forming a protection layer at least on a side wall face of the etched stacked body; further etching to a dimension in the third direction of the element isolation region; and controlling a size of a cross section parallel to the first and the second direction of the element isolation region by etching a portion of the side wall face on which the protection layer is not formed.

BRIEF DESCRIPTION OF THE DRAWINGS

FIG. 5A to FIG. 9B are schematic process cross-sectional views for illustrating a method for manufacturing a nonvolatile memory device according to this embodiment;

FIG. 13A to FIG. 16B are schematic process cross-sectional views for illustrating a method for manufacturing a nonvolatile memory device according to another embodiment.

DETAILED DESCRIPTION

Embodiments of the invention will now be illustrated with reference to the drawings. In the drawings, similar components are marked with like reference numerals, and a detailed description is omitted as appropriate.

Figure 1A:
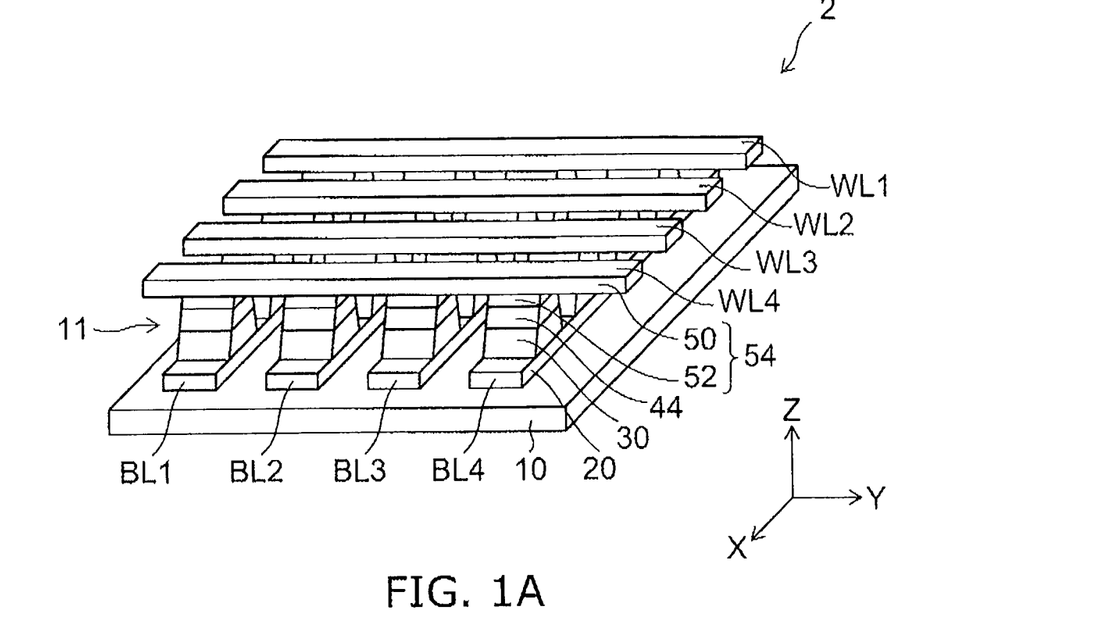
FIGS. 1A and 1B are schematic drawings of a nonvolatile memory device.
Figure 1B:
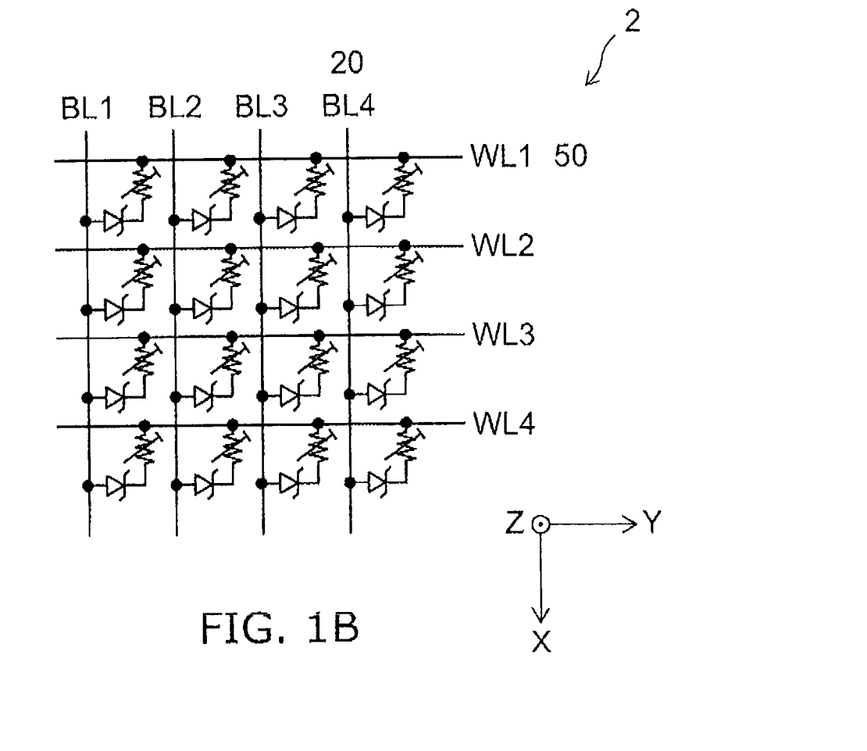

FIGS. 1A and 1B are schematic drawings of a nonvolatile memory device 2. FIG. 1A is a schematic perspective view of the nonvolatile memory device 2, and FIG. 2B is a schematic circuit diagram of the nonvolatile memory device 2.

Figure 2A:
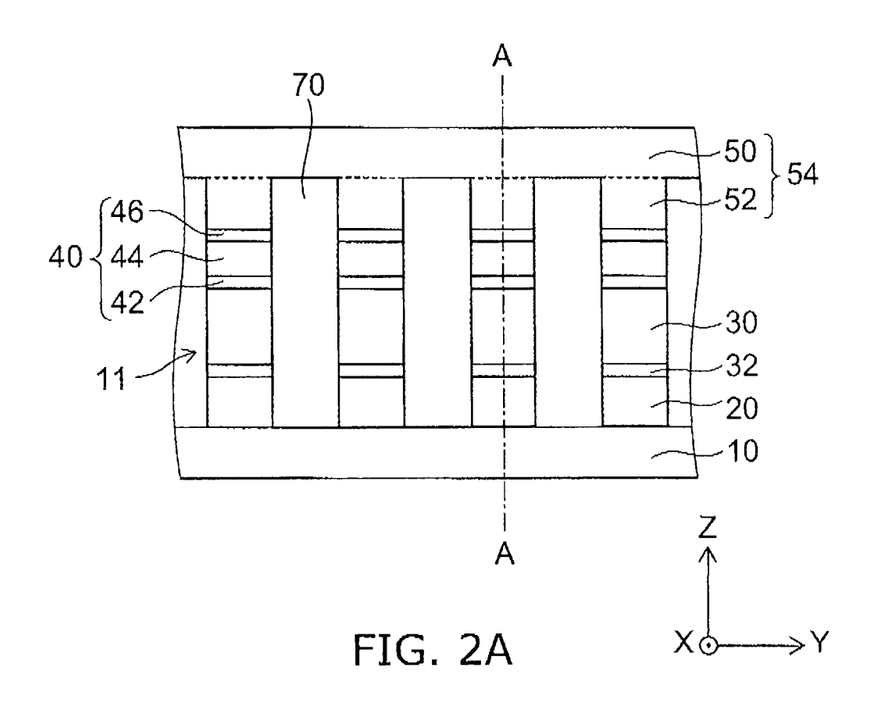
FIGS. 2A and 2B are schematic cross-sectional views of the nonvolatile memory device.
Figure 2B:
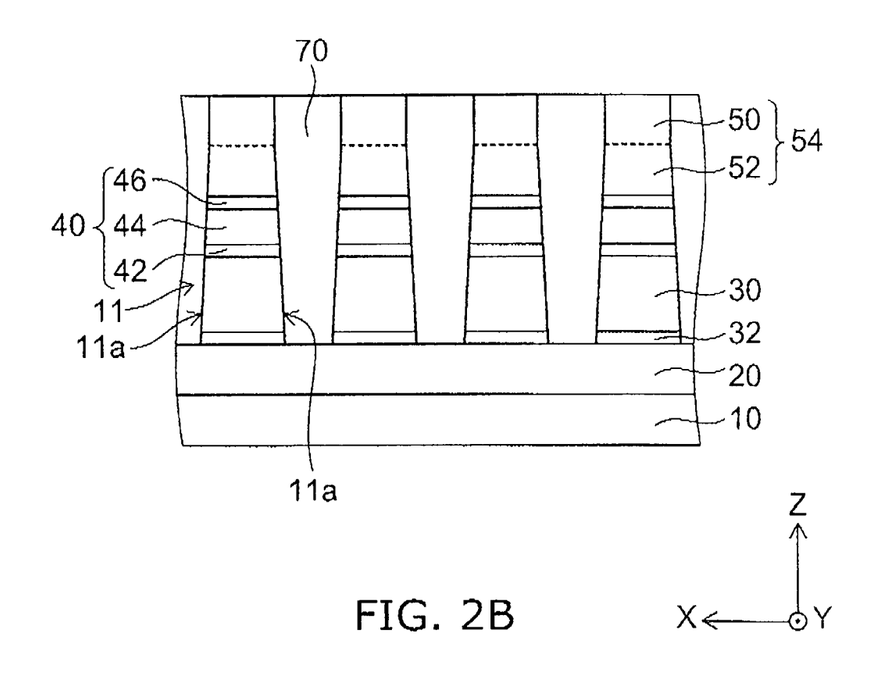

FIGS. 2A and 2B are schematic cross-sectional views of the nonvolatile memory device 2. FIG. 2A is a schematic cross-sectional view of the nonvolatile memory device 2 as viewed from a first direction (X-axis direction), and FIG. 2B is a cross-sectional view taken along line A-A of FIG. 2A.

Figure 3A:
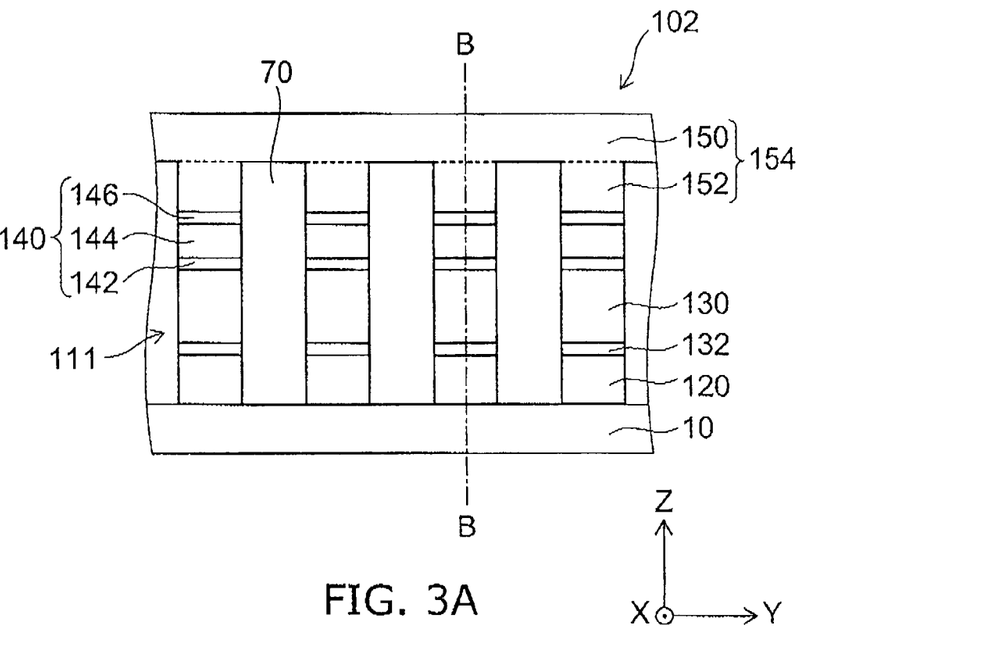
FIGS. 3A and 3B are schematic cross-sectional views of a nonvolatile memory device according to a comparative example.
Figure 3B:
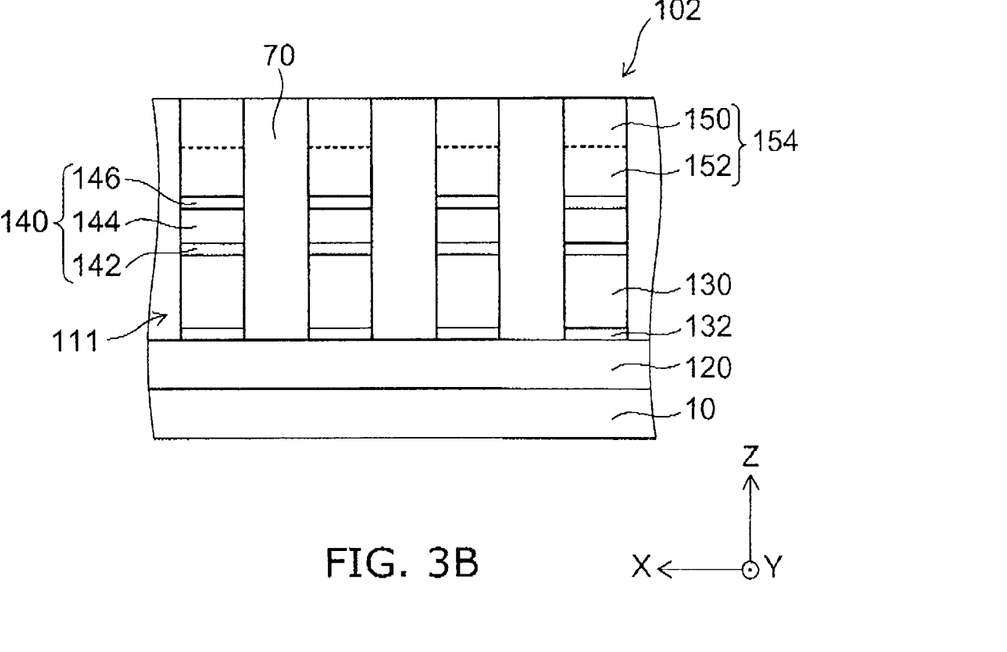

FIGS. 3A and 3B are schematic cross-sectional views of a nonvolatile memory device 102 according to a comparative example. FIG. 3A is a schematic cross-sectional view of the nonvolatile memory device 102 as viewed from the first direction (X-axis direction), and FIG. 3B is a cross-sectional view taken along line B-B of FIG. 3A.

In FIGS. 1A and 1B, the barrier layer 32 and the electrode layers 42 and 46 illustrated in FIGS. 2A and 2B are omitted.

One memory unit 40 provided in a region in which one first interconnection 20 and one second interconnection 50 intersect is one unit element for storing, and this is referred to as a "memory cell."

The nonvolatile memory device 2 illustrated in FIGS. 1A and 1B and FIGS. 2A and 2B is an example in which memory cells are stacked in one layer.

As illustrated in FIG. 1A, the nonvolatile memory device 2 includes: a substrate 10; the first interconnection 20 (a bit line BL) provided on the major surface of the substrate 10 and extending in the first direction (X-axis direction); the second interconnection 50 (a word line WL) extending in a second direction (Y-axis direction) nonparallel to (intersecting with) the first direction; and a memory layer 44 placed between the first interconnection 20 and the second interconnection 50 and capable of reversibly transitioning between a first state and a second state by a current supplied via the first interconnection 20 and the second wring 50. Further, the nonvolatile memory device 2 includes a rectifying element 30 provided between the first interconnection 20 and the memory layer 44 so as to be sandwiched therebetween.

Here, the "major surface" is a plane (XY plane in FIGS. 1A and 1B) perpendicular to the stack direction of the first interconnection 20, the rectifying element 30, the memory layer 44, and the like (Z-axis direction in FIGS. 1A and 1B).

Further, as illustrated in FIGS. 2A and 2B, electrode layers 42 and 46 sandwiching the memory layer 44 may be provided on both sides in the Z-axis direction of the memory layer 44. Here, the memory layer 44 and the electrode layers 42 and 46 are collectively referred to as a "memory unit 40." Further, a barrier layer 32 may be provided between the first interconnection 20 and the rectifying element 30.

A material having conductivity may be used for an interconnection L (the first interconnection 20 and the second interconnection 50). Furthermore, a material further having heat resistance may be used. For example, tungsten (W) may be used as a material having conductivity and heat resistance.

Furthermore, as illustrated in FIGS. 1A and 1B and FIGS. 2A and 2B, a stopper layer 52 necessary in the manufacturing process (planarizing process) may be provided between the memory layer 44 (the memory unit 40) and the second interconnection 50. In this case, when, for example, the CMP (chemical mechanical polishing) method is used in the planarizing process, the stopper layer 52 may be used as a CMP stopper layer. However, the stopper layer 52 is not necessarily needed but may be provided as necessary. For example, the electrode layer 46 may be provided with the function of a stopper layer by sufficiently thickening the electrode layer 46, which eliminates the need for providing the stopper layer 52.

Here, if the stopper layer 52 and the second interconnection 50 are formed of the same material, both integrally function as the second interconnection. The second interconnection in such a case is referred to as a "second interconnection 54." Accordingly, the second interconnection 54 has a protrusion (the stopper layer 52) protruding to the memory layer 44 side in each memory cell.

The rectifying element 30 has rectifying properties, and is provided in order to provide a directionality to the polarity of a voltage applied to the memory layer 44. A PN junction diode, Zener diode, Schottky diode, and the like, for example, may be used for the rectifying element 30.

Furthermore, the barrier layer 32 may be provided between the first interconnection 20 and the rectifying element 30 in order to suppress the diffusion of elements therebetween and the like.

Next, the memory unit 40 will now be illustrated with reference to FIGS. 2A and 2B.

As illustrated in FIGS. 2A and 2B, the memory unit 40 includes the memory layer 44 and the electrode layers 42 and 46 sandwiching the memory layer 44 in the Z-axis direction (stack direction).

The electrode layers 42 and 46 are provided as necessary so that the memory layer 44 may easily obtain an electrical connection. The electrode layers 42 and 46 may further function as, for example, barrier layers for suppressing the diffusion of elements between the memory layer 44 and the components in the Z-axis direction (stack direction) and the like.

Furthermore, a heater layer (a material with a resistivity of about $10^{-5}$ Ωcm or more) may be provided on the cathode side (in this case, the word line WL side) of the memory layer 44 in order to perform efficiently heating of the memory layer 44 in the erase (reset) operation. In this case, a barrier layer may be provided between the heater layer and the word line WL.

Next, the memory layer 44 will now be illustrated.

As described later, the nonvolatile memory device 2 can change the voltage applied to each memory unit 40 by the combination of potentials provided to the first interconnection 20 and the second interconnections 50; and can store (write) and erase information by characteristics (e.g. resistance value) of the memory unit 40 at the time. Therefore, the memory layer 44 is made of a material that changes its characteristics by an applied voltage. For example, a variable resistance layer capable of reversibly transitioning its resistance value, a phase change layer capable of reversibly transitioning between a crystal state and an amorphous state by an applied voltage, and the like may be illustrated as the memory layer 44.

Furthermore, metal oxide, for example, may be illustrated as the material of the memory layer 44. In this case, the following, for example, may be used: oxide and the like of chromium (Cr), tungsten (W), vanadium (V), niobium (Nb), tantalum (Ta), titanium (Ti), zirconium (Zr), hafnium (Hf), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi), what is called "rare-earth elements" from lanthanum (La) to lutetium (Lu), and the like.

Furthermore, aluminum oxide ($Al_2O_3$), copper oxide (CuO), silicon oxide ($SiO_2$), and the like may be used.

Moreover, composite oxide may be used. In this case, the following, for example, may be used: barium titanate ($BaTiO_3$), strontium titanate ($SrTiO_3$), calcium titanate ($CaTiO_3$), potassium niobate ($KNbO_3$), bismuth iron oxide ($BiFeO_3$), lithium niobate ($LiNbO_3$), sodium vanadate ($Na_3VO_4$), iron vanadate ($FeVO_3$), titanium vanadate ($TiVO_3$), cromium vanadate ($CrVO_3$), nickel vanadate ($NiVO_3$), magnesium vanadate ($MgVO_3$), calcium vanadate ($CaVO_3$), lanthanum vanadate ($LaVO_3$), vanadium molybdate ($VMoO_5$), vanadium molybdate ($V_2MoO_8$), lithium vanadate ($LiV_2O_5$), magnesium silicate ($Mg_2SiO_4$), magnesium silicate ($MgSiO_3$), zirconium titanate ($ZrTiO_4$), strontium titanate ($SrTiO_3$), lead magnesate ($PbMgO_3$), lead niobate ($PbNbO_3$), barium borate ($BaB_2O_4$), lanthanum chromate ($LaCrO_3$), lithium titanate ($LiTi_2O_4$), lanthanum cuprate ($LaCuO_4$), zinc titanate ($ZnTiO_3$), calcium tungstate ($CaWO_4$), and the like.

Furthermore, chalcogenide-based variable resistance materials may be used. "Chalcogenide" is a general term of compounds containing a group 16 element such as Se and Te, derived from a synonym of the group 16 elements, "the chalcogens." The chalcogenide-based material is a variable resistance material capable of reversibly transitioning between a crystal state and an amorphous state by applying a voltage.

Furthermore, amorphous carbon doped with nitrogen (ta-C:N; nitrogen-doped tetrahedral amorphous carbon) may be used.

Furthermore, Silicon Carbide (SiC) may be used.

An inter-element insulating layer 70 is provided between the memory cells as illustrated in FIGS. 2A and 2B.

A not-illustrated contact plug is provided on the outside in the extending direction of the interconnection L (the first interconnection 20 and the second interconnection 50, the bit line BL and the word line WL) with respect to the position of the memory cell. The contact plug is connected to a peripheral circuit such as a reading/storing circuit (writing circuit) for storing (writing) and reading out data (not illustrated). A current is supplied to the memory unit 40 via the contact plugs and the interconnections L, and thereby the memory unit 40 can perform various operations such as storing (writing) and erasing.

Thus, the nonvolatile memory device 2 in which the memory unit 40 is provided at the intersection of the bit line BL and the word line WL is referred to as what is called a "crosspoint nonvolatile memory device (memory)."

As illustrated in FIG. 1A and FIG. 2B, a stacked body 11 (the first interconnection 20 (the bit line BL), the barrier layer 32, the rectifying element 30, the memory unit 40 (the electrode layer 42, the memory layer 44, and the electrode layer 46), and the stopper layer 52) stacked on the major surface of the substrate 10 has a configuration in which the cross-sectional dimension in the direction substantially perpendicular to the stack direction gradually decreases with distance from the first interconnection 20 (the bit line BL). That is, a face 11a of the stacked body 11 in the direction substantially parallel to the stack direction inclines so that faces 11a come close to each other with distance from the first interconnection 20 (the bit line BL).

Herein, the nonvolatile memory device 102 according to a comparative example illustrated in FIGS. 3A and 3B will now be illustrated.

As illustrated in FIGS. 3A and 3B, also in the nonvolatile memory device 102, a interconnection 120 (the bit line BL), a barrier layer 132, a rectifying element 130, a memory unit 140 (an electrode layer 142, a memory layer 144, and an electrode layer 146), and a interconnection 154 (a stopper layer 152 and a interconnection 150) are provided to be stacked on the major surface of the substrate 10. A stacked body 111 (the interconnection 120 (the bit line BL), the barrier layer 132, the rectifying element 130, the memory unit 140 (the electrode layer 142, the memory layer 144, and the electrode layer 146), and the stopper layer 152) stacked on the major surface of the substrate 10 has a uniform cross-sectional dimension in the direction substantially perpendicular to the stack direction. That is, the stacked body 111 has a rectangular parallelepiped shape.

In the nonvolatile memory device 102 including the stacked body 111 thus configured, for example, in order to achieve low power, a situation may be created where the current flowing in the memory layer 144 is small. Therefore, the memory layer 144 is preferably configured to have a small cross-sectional dimension in the direction substantially perpendicular to the stack direction.

On the other hand, when performing the erase (reset) operation, a large current at a low voltage flows in the rectifying element 130. Therefore, in order to reduce the load of the rectifying element 130, the rectifying element 130 is preferably configured to have a large cross-sectional dimension in the direction substantially perpendicular to the stack direction.

However, in the stacked body 111, since the cross-sectional dimension in the direction substantially perpendicular to the stack direction is uniform, a cross-sectional dimension desirable for both the memory layer 144 and the rectifying element 130 may not be obtained. Consequently, future improvements may be difficult in electrical characteristics of the nonvolatile memory device 102.

Figure 4:
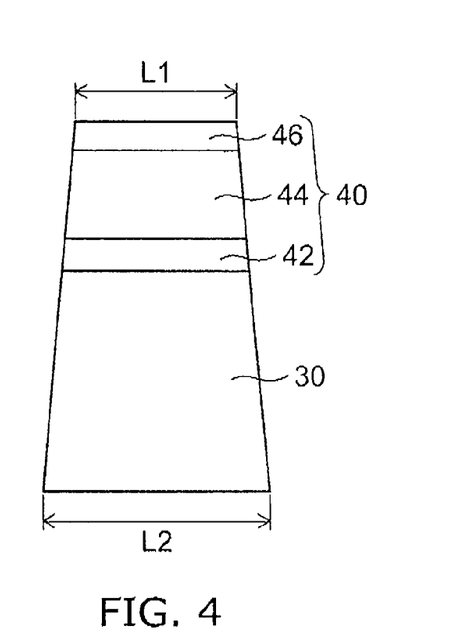
FIG. 4 is a schematic view for illustrating the improvement of electrical characteristics.

FIG. 4 is a schematic view for illustrating the improvement of electrical characteristics.

As described above, in order to achieve low power, a situation may be created where the current flowing in the memory layer 44 is small; and in order to reduce the load of the rectifying element 30, a situation may be created where a large current can be passed. Therefore, the memory layer 44 is preferably configured to have a small cross-sectional dimension in the direction substantially perpendicular to the stack direction, and the rectifying element 30 is preferably configured to have a large cross-sectional dimension in the direction substantially perpendicular to the stack direction.

In this embodiment, the cross-sectional dimension L1 of one end of the memory layer 44 is made small to satisfy the requirement of achieving low power. That is, the memory layer 44 has a configuration in which the cross section parallel to the first and second directions decreases toward the second interconnection 50.

Furthermore, the cross-sectional dimension L2 of one end of the rectifying element 30 is made large to satisfy the requirement of reducing the load of the rectifying element 30. That is, the rectifying element 30 provided between the first interconnection 20 and the memory layer 44 has a configuration in which the cross section parallel to the first and second directions decreases toward the second interconnection 50.

Furthermore, an end of the memory layer 44 on the first interconnection 20 side and an end of the rectifying element 30 on the second interconnection 50 side are made substantially equal in size. That is, the bottom face of the memory layer 44 and the top face of the rectifying element 30 are made substantially equal in size. Accordingly, the cross-sectional dimension can change continuously, and rapid change in electrical characteristics can be therefore suppressed.

In what are illustrated in FIGS. 1A and 1B, FIGS. 2A and 2B, and FIG. 4, the cross-sectional dimension is changed by inclining a pair of opposite faces 11a of the stacked body 11. However, the configuration is not limited to this. For example, only one face may be inclined, or all side faces may be inclined like a truncated pyramid, a truncated cone, or the like. Furthermore, the inclined face may be formed by a straight line or a curved line. Furthermore, it may be formed by a straight line and a curved line.

In FIGS. 1A and 1B, FIGS. 2A and 2B, and FIG. 4, the case is illustrated where the rectifying element 30 is provided on the first interconnection 20 (the bit line BL) side. However, the memory layer 44 may be provided on the first interconnection 20 (the bit line BL) side. In such a case, the cross-sectional dimension in the direction substantially perpendicular to the stack direction may be gradually decreased toward the first interconnection 20 (the bit line BL).

That is, the cross-sectional dimension in the direction substantially perpendicular to the stack direction may be gradually decreased from the rectifying element 30 toward the memory layer 44.

Furthermore, although the nonvolatile memory device may have a configuration in which memory cells are formed of one layer, memory cells may be stacked in the Z-axis direction in order to achieve a large memory capacity. In this case, for example, an interlayer insulating film may be provided and the second interconnection 50 (the word line WL) may be provided for each layer. Furthermore, a stack configuration is possible in which the second interconnection 50 (the word line WL) is shared. There are no limitations on the number of stacked layers in particular and it may be altered as appropriate.

Furthermore, for example, the number, arrangement, and the like of the first interconnection 20, the second interconnection 50, the memory unit 40 (the memory layer 44), and the like are not limited to those illustrated in FIGS. 1A and 1B and FIGS. 2A and 2B, but may be altered as appropriate.

Although the first interconnection 20 and the second interconnection 50 are referred to as the "bit line BL" and the "word line WL," respectively, in the case described above, the first interconnection 20 and the second interconnection 50 may be conversely referred to as the "word line WL" and the "bit line BL", respectively.

Furthermore, at both ends in the Z-axis direction (stack direction) of the nonvolatile memory device 2, interconnections of the same kind (for example, two bit lines BL or two word lines WL) may be disposed, or interconnections of different kinds (for example, a bit line BL and a word line WL) may be disposed.

Next, the operation of the nonvolatile memory device 2, namely, the store (write) operation, read operation, and erase operation on the memory cell will now be illustrated.

In order to perform the store (write) operation, a voltage may be applied to a selected memory cell to generate a potential gradient in the memory cell to pass a current pulse. In this case, for example, the bit line BL may be set at the ground potential and a negative potential may be applied to the word line WL to create a state in which the word line WL has a relatively lower potential than the bit line BL.

Since the selected memory cell is provided with an electron conductivity by a phase change and the like, the store (write) operation is completed.

The current pulse for the store (write) operation may be generated also by creating a state in which the word line WL has a relatively higher potential than the bit line BL.

The read operation is performed by passing a current pulse in a selected memory cell and detecting the resistance value of the memory cell. Here, the current pulse needs to be a value small enough not to cause a resistance change of the material of the memory cell.

In order to perform the erase (reset) operation, a selected memory cell may be Joule-heated by a large current pulse to turn the memory cell back to its former resistance state.

According to this embodiment, since the cross-sectional dimension in the direction substantially perpendicular to the stack direction is gradually decreased from the rectifying element 30 toward the memory layer 44, low power can be achieved and the load of the rectifying element 30 can be reduced. Furthermore, since the cross-sectional dimension changes continuously, rapid change in electrical characteristics can be suppressed. Therefore, electrical characteristics of the nonvolatile memory device 2 can be improved.

Next, a method for manufacturing a nonvolatile memory device according to this embodiment will now be illustrated.

FIG. 5A to FIG. 9B are schematic process cross-sectional views for illustrating a method for manufacturing a nonvolatile memory device according to this embodiment.

In this embodiment, an example is illustrated in which a two-layered crosspoint nonvolatile memory device is manufactured in the interconnection formation process after forming a peripheral circuit, where the stopper layer 52 described above is not provided.

Figure 5A:
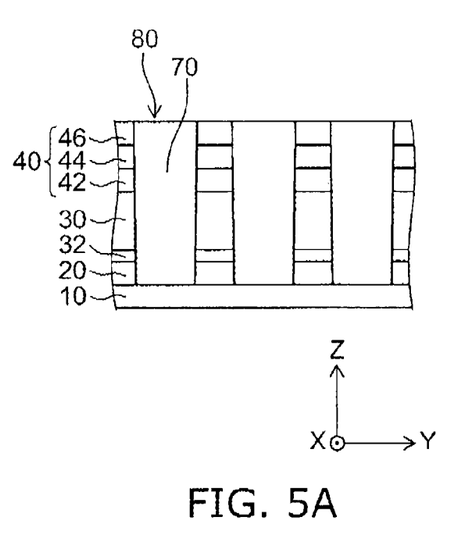
Figure 5B:
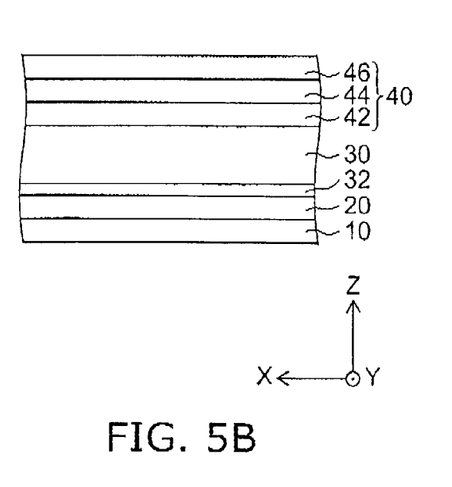

First, as illustrated in FIGS. 5A and 5B, layers that form the first interconnection 20 (the bit line BL), the barrier layer 32, the rectifying element 30, the electrode layer 42, the memory layer 44, and the electrode layer 46 are formed in this order from below on the major surface of the substrate 10. That is, these are stacked in the direction (Z-axis direction) substantially perpendicular to the first direction (X-axis direction) and the second direction (Y-axis direction) to form a stacked body. The sputtering method, thermal CVD (chemical vapor deposition) method, plasma CVD method, ALD (atomic layer deposition) method, and the like, for example, may be illustrated as the formation method. In this case, using the ALD method can perform good film-formation at low temperatures, and therefore obtain a good thermal history and step covering properties.

Tungsten (W), for example, may be illustrated as the material of the first interconnection 20. The materials described above may be used as the material of the memory layer 44. A pin (p-type semiconductor/insulator/n-type semiconductor) diode, for example, may be illustrated as the rectifying element 30. The barrier layer 32 and the electrode layers 42 and 46 are provided as necessary. Titanium and titanium nitride, for example, may be illustrated as the material of them.

A not-illustrated etching mask (resist mask) having openings extending in the first direction (X-axis direction) is formed on the major surface of the stacked body (the stack of the first interconnection 20 to the electrode layer 46), and etching is performed to form a first element isolation region 80. At this time, the etching is performed to the depth of the interface between the substrate 10 and the first interconnection 20. The point is described later that, when forming the first element isolation region 80, the cross-sectional dimension of the stacked body in the direction substantially perpendicular to the stack direction is gradually decreased with distance from the first interconnection 20.

Next, after the not-illustrated etching mask is removed, burying is performed by using, for example, the spin coat method to form the inter-element insulating layer 70. Polysilazane and the like, for example, may be illustrated as the application agent used at this time.

Then, the major surface of the stacked body in which burying has been thus performed is planarized by using, for example, the CMP method.

Figure 6A:
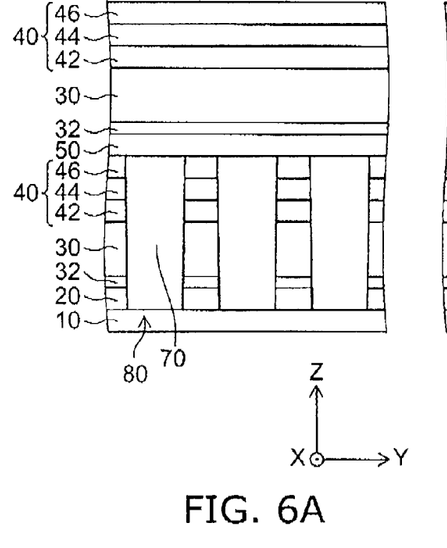
Figure 6B:
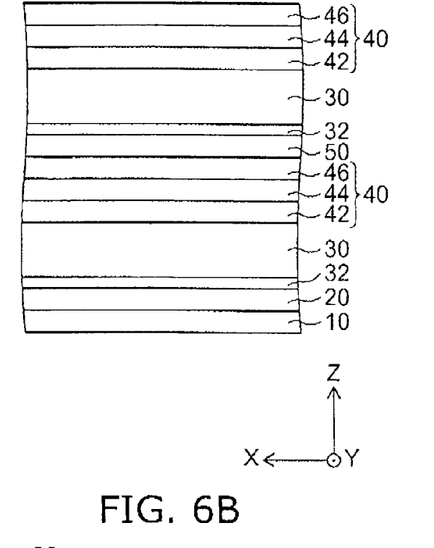

Next, the second layer is stacked as illustrated in FIGS. 6A and 6B.

That is, layers that form the second interconnection 50 (the word line WL), the barrier layer 32, the rectifying element 30, the electrode layer 42, the memory layer 44, and the electrode layer 46 are formed in this order from below on the major surface of the stacked body which has been planarized as described above. In this case, tungsten, for example, may be illustrated as the material of the second interconnection 50. The materials of the other layers and the method for forming the layers may be similar to those described above.

Figure 7A:
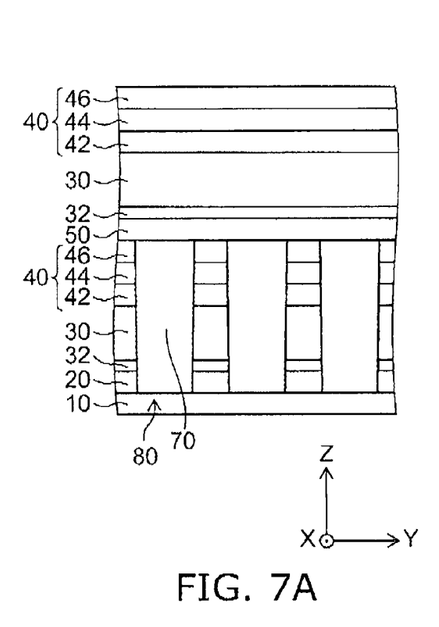
Figure 7B:
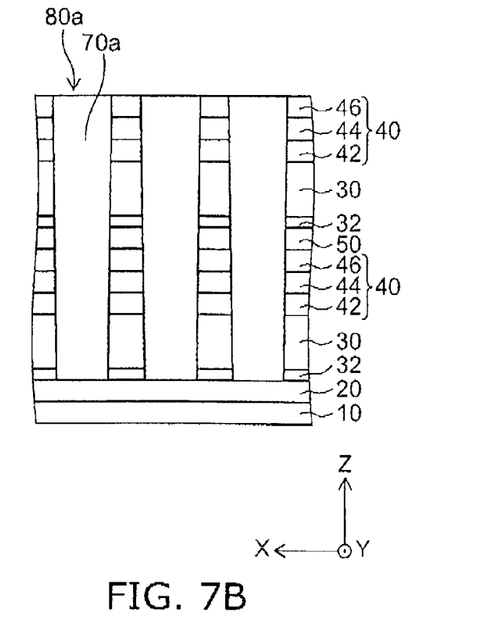

Next, as illustrated in FIG. 7B, a not-illustrated etching mask (resist mask) having openings extending in the second direction (Y-axis direction) is formed, and etching is performed to form a second element isolation region 80a. At this time, the etching is performed to the depth of the interface between the first interconnection 20 and the barrier layer 32. That is, the region from the major surface (upper face) of the second layer to the major surface of the first interconnection 20 is etched to form a second element isolation region 80a. The point is described later that, when forming the second element isolation region 80a, the cross-sectional dimension of the stacked body in the direction substantially perpendicular to the stack direction is gradually decreased with distance from the first interconnection 20.

Then, after the not-illustrated etching mask is removed as in the case described above, burying is performed by using, for example, the spin coat method to form an inter-element insulating layer 70a. Polysilazane and the like, for example, may be illustrated as the application agent used at this time. After that, the major surface of the stacked body in which burying has been thus performed is planarized by using, for example, the CMP method.

Figure 8A:
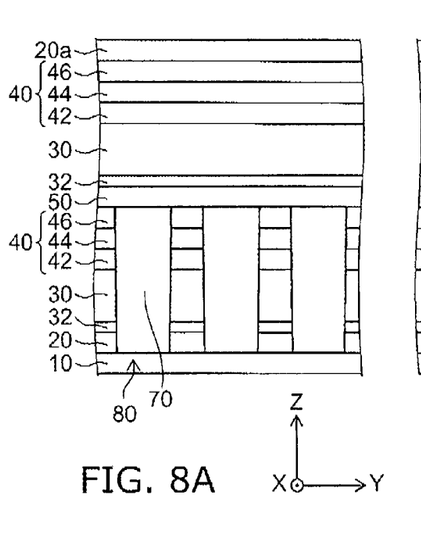
Figure 8B:
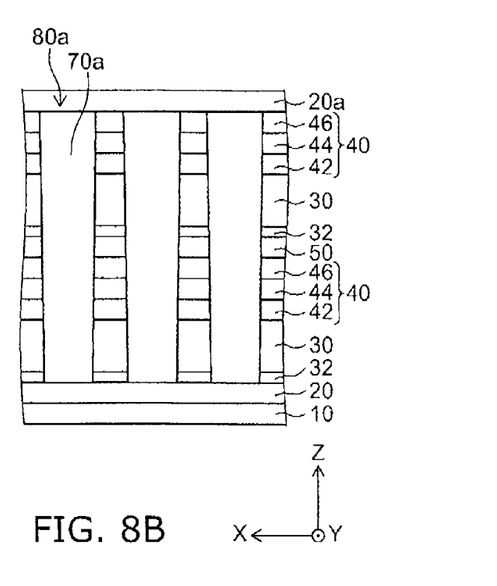

Next, as illustrated in FIGS. 8A and 8B, a layer that forms a third interconnection 20a (the bit line BL) is formed on the major surface of the stacked body which has been planarized as described above.

Figure 9A:
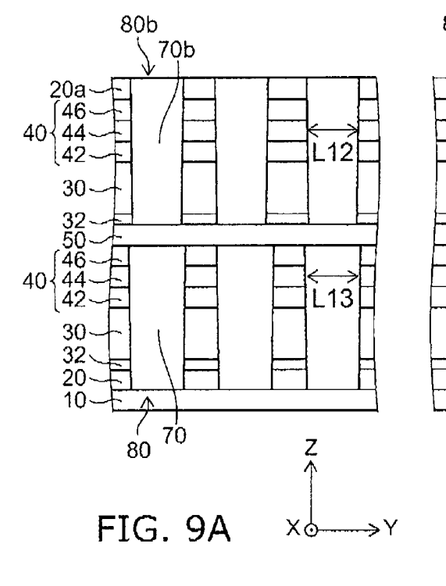
Figure 9B:
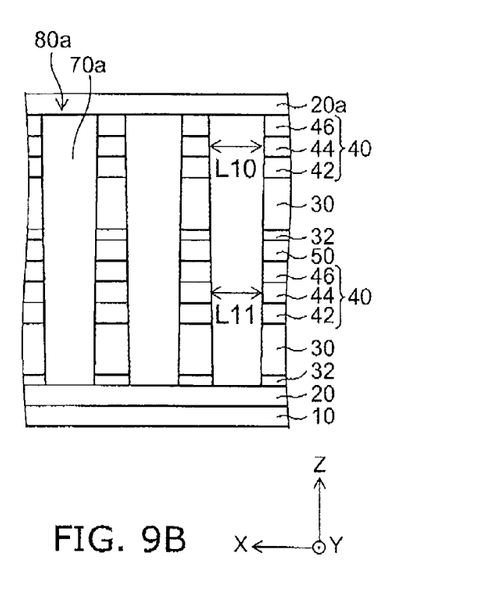

Next, as illustrated in FIGS. 9A and 9B, a not-illustrated etching mask (resist mask) having openings extending in the first direction (X-axis direction) is formed on the major surface of the stacked body, and etching is performed to form a third element isolation region 80b. At this time, the etching is performed to the depth of the interface between the barrier layer 32 and the second interconnection 50. The point is described later that, when forming the third element isolation region 80b, the cross-sectional dimension of the stacked body in the direction substantially perpendicular to the stack direction is gradually decreased with distance from the first interconnection 20.

Next, after the not-illustrated etching mask is removed, burying is performed by using, for example, the spin coat method to form an inter-element insulating layer 70b. Polysilazane and the like, for example, may be illustrated as the application agent used at this time.

Then, the major surface of the stacked body in which burying has been thus performed is planarized by using, for example, the CMP method.

Thus, a crosspoint nonvolatile memory device is formed that shares the second interconnection 50 (the word line WL) and includes the first interconnection 20 (the bit line BL) and the third interconnection 20a (the bit line BL) on the ends in the Z-axis direction.

Herein, the formation of the first element isolation region 80, the second element isolation region 80a, and the third element isolation region 80b described above will now be further illustrated.

When an element isolation region is formed by etching, the cross-sectional dimension in the direction substantially perpendicular to the Z-axis direction may decrease with dimension from the processing surface (in other words, with depth). For example, the cross-sectional dimension L11 may be smaller than the cross-sectional dimension L10 illustrated in FIG. 9B. This tendency is marked when a highly isotropic etching processing method is used. On the other hand, if the dimension from the processing surface is not so different, the cross-sectional dimensions in the direction substantially perpendicular to the Z-axis direction tend to be equal. For example, the cross-sectional dimensions L12 and L13 illustrated in FIG. 9A are equal to the cross-sectional dimension L10 described above.

This indicates that the cross-sectional dimension of the stacked body in the direction substantially perpendicular to the stack direction gradually decreases with distance from the first interconnection 20.

However, this indicates also that, if the dimension from the processing surface is different, the cross-sectional dimension of the stacked body is different. Accordingly, for example, the cross-sectional dimension of the memory layer 44 in the direction substantially perpendicular to the stack direction may vary between stacked layers, and switching characteristics may vary between the layers.

In such a case, a method may be employed in which the element isolation regions 80 and 80b provided for the layers are formed as illustrated in FIG. 9A, instead of a method in which the element isolation region 80a penetrating through a plurality of layers is formed as illustrated in FIG. 9B. Thereby, the memory layers 44 and the rectifying elements 30 provided for the layers can be made substantially equal in cross-sectional dimension in the direction substantially perpendicular to the stack direction. However, such a method requires one more lithography process and may increase the manufacturing cost. Furthermore, the method may cause a misalignment in lithography process, which may lead to a decrease in yield.

Therefore, it is preferable that: the cross-sectional dimension of the stacked body in the direction substantially perpendicular to the stack direction is gradually decreased with distance from the first interconnection 20 when forming the element isolation region; and even when an element isolation region penetrating through a plurality of layers is formed, the memory layers 44 and the rectifying elements 30 provided for the layers are made substantially equal in cross-sectional dimension in the direction substantially perpendicular to the stack direction.

Accordingly, in this embodiment, etching processing methods, etching conditions, and the like are appropriately determined to gradually decrease the cross-sectional dimension of the stacked body in the direction substantially perpendicular to the stack direction with distance from the first interconnection 20 when forming the element isolation region. More specifically, etching processing methods, etching conditions, and the like are appropriately determined to control the etching amount in the direction substantially perpendicular to the stack direction, and thereby the cross-sectional dimension of the stacked body in the direction substantially perpendicular to the stack direction is gradually decreased with distance from the first interconnection 20. As a method for controlling the etching amount in the direction substantially perpendicular to the stack direction, controlling the amount of radicals for isotropic etching and the amount of ions for anisotropic etching in the dry etching method and the like, for example, may be illustrated.

If the element isolation region has a certain level of depth, the cross-sectional dimension of the stacked body in the direction substantially perpendicular to the stack direction has a strong tendency to gradually decrease with distance from the first interconnection 20. Therefore, intentional control of the etching amount in the direction substantially perpendicular to the stack direction may be omitted according to the depth of the element isolation region. For example, in those cases where memory cells are stacked in a plurality of layers and an element isolation region penetrating through the plurality of layers is formed, intentional control of the etching amount in the direction substantially perpendicular to the stack direction may be omitted.

In those cases where an element isolation region penetrating through a plurality of layers is formed, the dimension of the etching mask (resist mask) is controlled so that the memory layers 44 and the rectifying elements 30 provided for the layers may become substantially equal in cross-sectional dimension in the direction substantially perpendicular to the stack direction. That is, the dimension of the etching mask (resist mask) is controlled in the lithography process (the process of forming the etching mask) at the time of forming such an element isolation region. For example, a method may be illustrated in which the dimension of the openings of the etching mask is controlled so as to decrease with the depth of the element isolation region.

In this case, the dimensional control of the openings of the etching mask may be performed by changing the dimension of a photomask (reticle). Furthermore, it may be performed also by changing lithography conditions (e.g. dose, focus, etc.). If the dimensional control of the openings of the etching mask is performed by changing lithography conditions, prompt action is possible even when the depth of the element isolation region changes. Furthermore, since the types of photomasks (reticles) can be decreased, complicated operations can be suppressed and the cost can be reduced.

The control amount of the dimension of the etching mask (the control amount of the opening dimension) may be determined as appropriate in view of the depth of the element isolation region, etching processing methods, etching conditions, the material of the member to be etched, and the like.

When determining the control amount of the dimension of the etching mask, the cross-sectional dimension of the memory layer 44 and the rectifying element 30 illustrated in FIG. 4 is preferably taken into consideration.

For example, in order to achieve low power, the cross-sectional dimension of the memory layer 44 is preferably made small; and in order to reduce the load of the rectifying element 30, the cross-sectional dimension of the rectifying element 30 is preferably made large. Therefore, it is preferable to determine the control amount of the dimension of the etching mask so as to obtain the cross-sectional dimensions L1 and L2 (see FIG. 4) desirable for both achieving low power and reducing the load of the rectifying element 30.

Although what is illustrated in FIG. 5A to FIG. 9B is the case of manufacturing a two-layered crosspoint nonvolatile memory device, a device in which three or more layers are stacked also can be similarly manufactured.

Figure 10A:
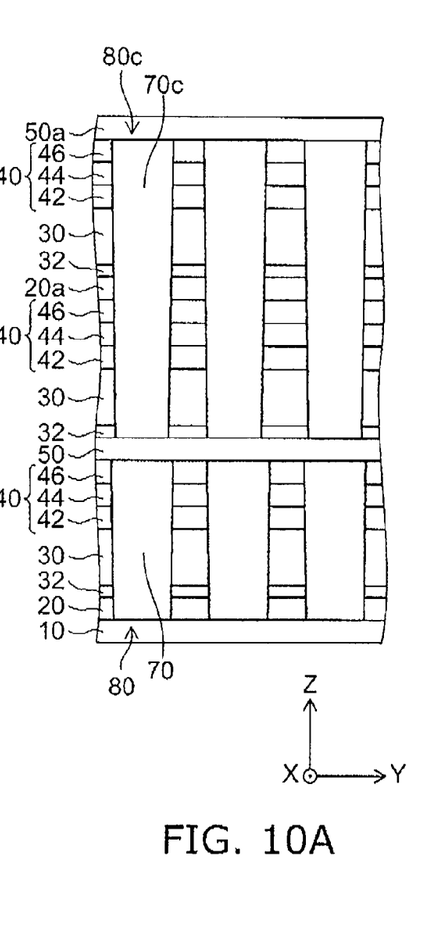
FIGS. 10A and 10B are the case where three layers are stacked and the word line WL and the bit line BL are shared.
Figure 10B:
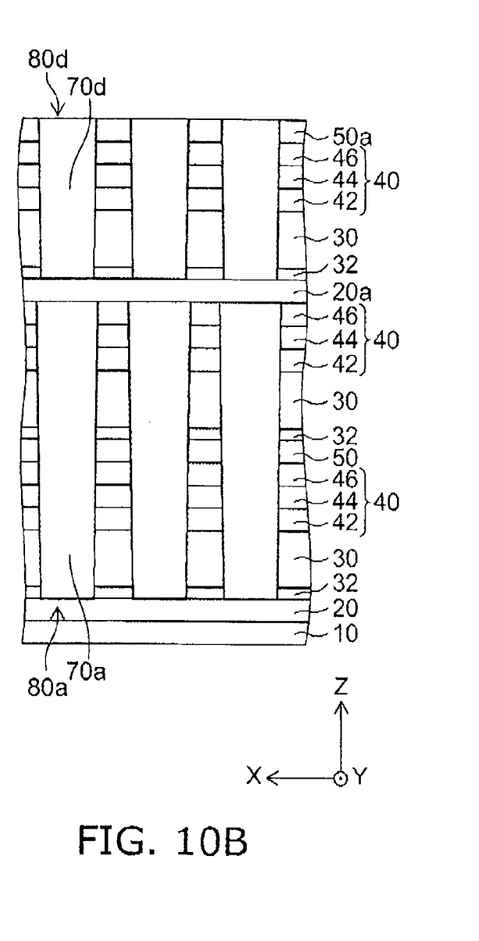

FIGS. 10A and 10B are the case where three layers are stacked and the second interconnection 50 (the word line WL) and the third interconnection 20a (the bit line BL) are shared.

In the case of what is illustrated in FIGS. 10A and 10B, by repeating the procedures described above, three layers are stacked, the element isolation regions 80, 80a, 80c, and 80d are formed, and the inter-element insulating layers 70, 70a, 70c, and 70d are provided.

Figure 11A:
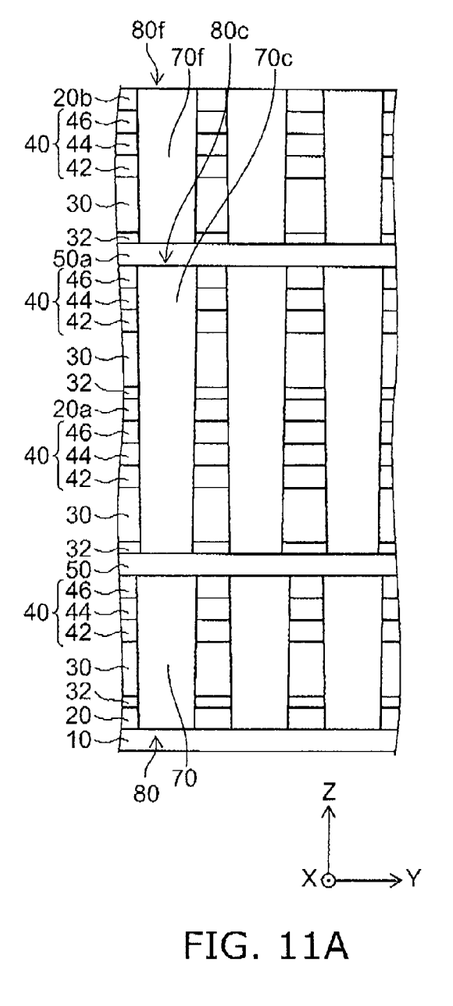
FIGS. 11A and 11B are the case where: four layers are stacked; the word lines WL and the bit line BL are shared; and another bit line BL is provided on the top.
Figure 11B:
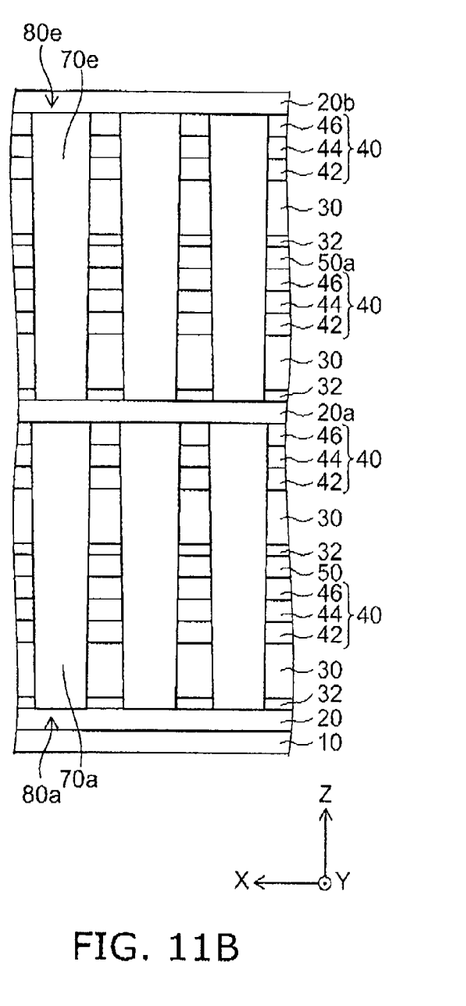

FIGS. 11A and 11B are the case where: four layers are stacked; the second interconnection 50 (the word line WL), the third interconnection 20a (the bit line BL), and the fourth interconnection 50a (the word line WL) are shared; and a fifth interconnection 20b (the bit line BL) is provided on the top.

In the case of what is illustrated in FIGS. 11A and 11B, by repeating the procedures described above, four layers are stacked, the element isolation regions 80, 80a, 80c, 80e, and 80f are formed, and the inter-element insulating layers 70, 70a, 70c, 70e, and 70f are provided.

Even in those cases illustrated in FIGS. 10A and 10B and FIGS. 11A and 11B, the dimensional control of the etching mask may be performed according to the depth of the element isolation region to be formed and the like. Therefore, the memory layers 44 and the rectifying elements 30 provided for the layers can be made substantially equal in cross-sectional dimension in the direction substantially perpendicular to the stack direction. Furthermore, a cross-sectional dimension desirable for both achieving low power and reducing the load of the rectifying element 30 can be obtained.

The number of stacked layers, the type of shared interconnection, and the like are not limited to those illustrated but may be appropriately altered.

What are illustrated in the above are the case where a resist mask is used as the etching mask. However, the dimensional control of the etching mask (hard mask) can be performed also in the case where a hard mask is used to form the element isolation region.

Figure 12A:
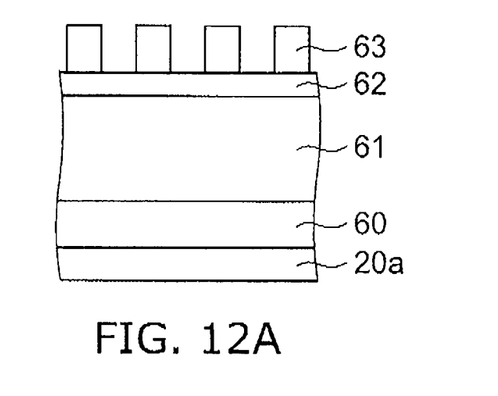
FIGS. 12A to 12C are schematic process cross-sectional views for illustrating the dimensional control of the etching mask (hard mask)
Figure 12B:
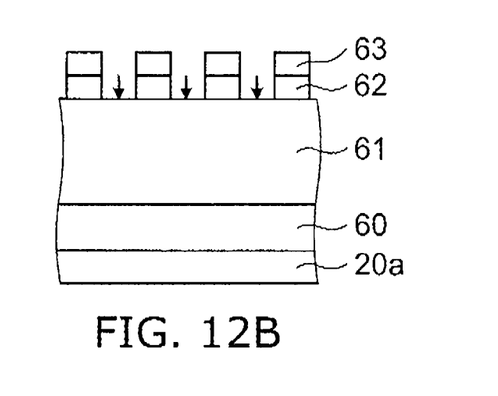
Figure 12C:
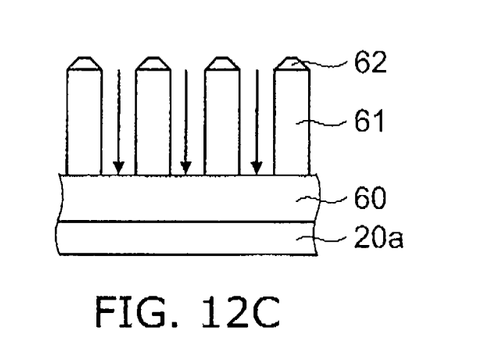

FIGS. 12A to 12C are schematic process cross-sectional views for illustrating the dimensional control of the etching mask (hard mask).

First, as illustrated in FIG. 12A, a layer that forms a hard mask 60, a layer that forms a lower resist mask 61, an SOG (spin on glass) layer 62, and a layer that forms an upper resist mask 63 are formed in this order from below on a face on which the hard mask will be formed (for example, the major surface of the layer that forms the third interconnection 20a (the bit line BL) illustrated in FIGS. 8A and 8B). In this case, SiN, $SiO_2$, SiC, and the like, for example, may be used as the material of the hard mask 60.

Then, the lithography method is used to form the upper resist mask 63 having openings.

Next, as illustrated in FIG. 12B, the upper resist mask 63 is used to etch the SOG (spin on glass) layer 62. Plasma etching processing using a $CF_x$-based gas as process gas, for example, may be illustrated as the etching processing method.

Next, as illustrated in FIG. 12C, the remaining upper resist mask 63 and the etched SOG layer 62 are used as a mask to form the lower resist mask 61. Plasma etching processing using a gas such as $NH_3$, $CH_4$, $N_2$, and $O_2$ as process gas, for example, may be used for the formation of the lower resist mask 61.

Next, the remaining SOG layer 62 and the lower resist mask 61 are used to form the hard mask 60. Plasma etching processing using a $CF_x$-based gas as process gas, for example, may be used for the formation of the hard mask 60.

Then, the remaining lower resist mask 61 is removed, and the formed hard mask 60 is used to form the element isolation region described above.

In this case, for example, during the formation of the masks formed from the SOG layer 62, the lower resist mask 61, and the hard mask 60, the etching conditions, gas mixture ratio, power, pressure, and the like of at least one of the above members may be controlled. Thereby, the dimensional control of the hard mask 60 (etching mask) to be formed can be performed.

Photoexposure using an ArF resist or the nanoimprint lithography method may be used as the lithography. The SOG layer 62 and the layer that forms the lower resist mask 61 may be formed by application or by using the plasma CVD method and the like.

That is, the method for manufacturing a nonvolatile memory device according to this embodiment is a method for manufacturing a nonvolatile memory device in which memory cells are stacked in a plurality of layers, the memory cell including: the first interconnection 20 extending in the first direction; the second interconnection 50 extending in the second direction nonparallel to the first direction; and the memory layer 44 placed between the first interconnection 20 and the second interconnection 50 and capable of reversibly transitioning between a first state and a second state by a current supplied via the first interconnection 20 and the second interconnection 50, and the method including: stacking at least a layer that forms the first interconnection 20, a layer that forms the memory layer 44, and a layer that forms the second interconnection 50 on the substrate 10 in the third direction substantially perpendicular to the first direction and the second direction to form a stacked body; providing an etching mask having an opening on the stacked body; and etching the stacked body via the etching mask to form an element isolation region, where, in providing the etching mask, the dimension of the opening of the etching mask is decreased with the dimension in the third direction of the element isolation region (in other words, with depth).

In this case, a resist mask or a hard mask may be used as the etching mask.

According to the method for manufacturing a nonvolatile memory device according to this embodiment, the cross-sectional dimension of the stacked body in the direction substantially perpendicular to the stack direction can be gradually decreased with distance from the first interconnection 20 by appropriately determining etching processing methods, etching conditions, and the like as necessary.

Furthermore, even in those cases where an element isolation region penetrating through a plurality of layers is formed, the memory layers 44 and the rectifying elements 30 provided for the layers can be made substantially equal in cross-sectional dimension in the direction substantially perpendicular to the stack direction, by controlling the dimension of the etching mask (resist mask or hard mask). Furthermore, the memory layer 44 and the rectifying element 30 that can achieve low power and reduce the load of the rectifying element 30 can be formed. Therefore, a nonvolatile memory device excellent in electrical characteristics can be obtained.

Next, a method for manufacturing a nonvolatile memory device according to another embodiment will now be illustrated.

FIG. 13A to FIG. 16B are schematic process cross-sectional views for illustrating a method for manufacturing a nonvolatile memory device according to another embodiment.

First, as in the case illustrated in FIGS. 5A and 5B, layers that form the first interconnection 20 (the bit line BL), the barrier layer 32, the rectifying element 30, the electrode layer 42, the memory layer 44, and the electrode layer 46 are formed in this order from below on the major surface of the substrate 10. Then, the first element isolation region 80 is formed and burying is performed to form the inter-element insulating layer 70.

Next, the major surface of the stacked body (the stack of first interconnection 20 to the electrode layer 46) in which burying has been performed is planarized by using, for example, the CMP method.

Then, as in the case illustrated in FIGS. 6A and 66, layers that form the second interconnection 50 (the word line WL), the barrier layer 32, the rectifying element 30, the electrode layer 42, the memory layer 44, and the electrode layer 46 are formed in this order from below on the planarized major surface of the stacked body.

Figure 13A:
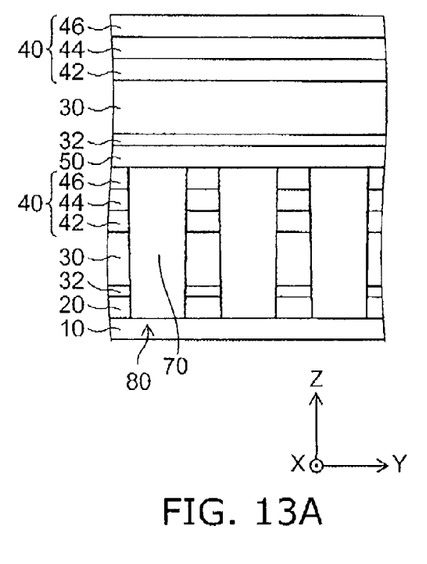
Figure 13B:
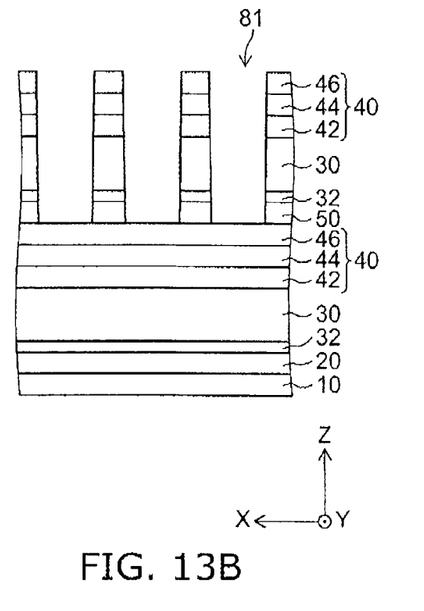

Next, as illustrated in FIG. 13B, a not-illustrated etching mask having openings extending in the second direction (Y-axis direction) is formed, and etching processing is performed to form an element isolation region 81. At this time, the etching is performed to the depth of the interface between the second interconnection 50 and the electrode layer 46.

Figure 14A:
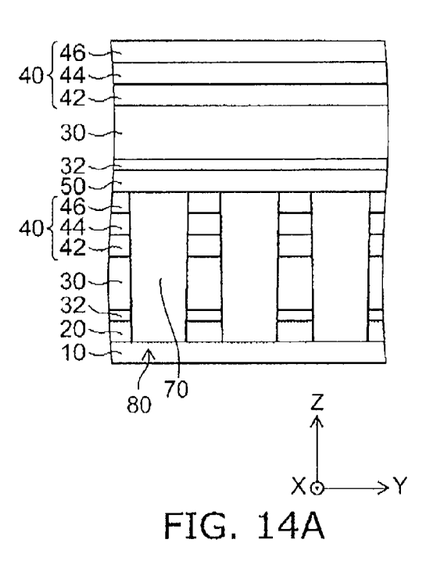
Figure 14B:
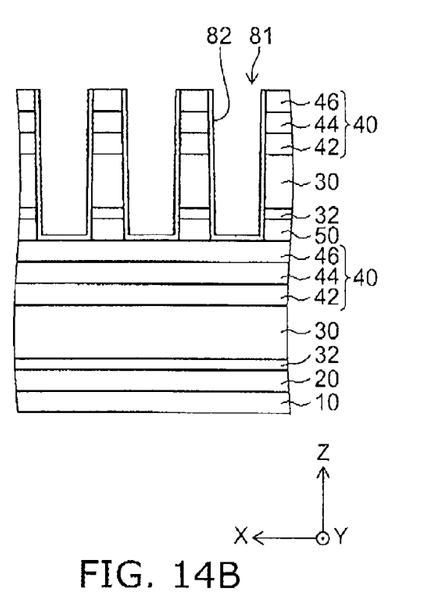

Next, as illustrated in FIG. 14B, a protection layer 82 is formed on the inner wall face of the element isolation region 81. It is sufficient to form the protection layer 82 at least on the side wall face of the etched stacked body. SiN and the like, for example, may be illustrated as the material of the protection layer 82. The ALD (atomic layer deposition) method, LP-CVD method, and the like, for example, may be illustrated as the method for forming the protection layer 82.

Figure 15A:
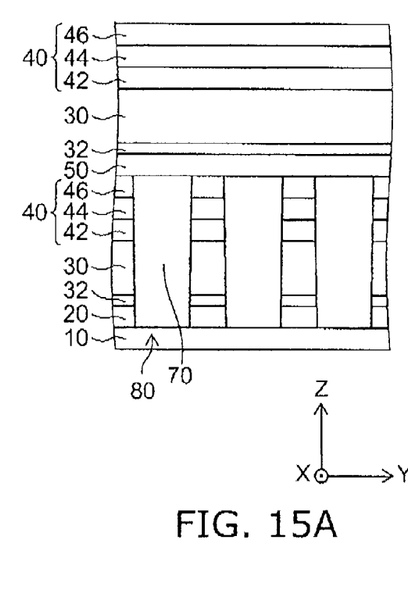
Figure 15B:
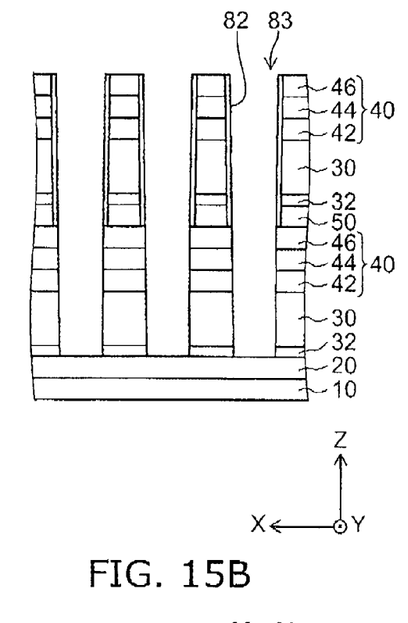

Next, as illustrated in FIG. 15B, the element isolation region 81 is further etched in the stack direction (Z-axis direction) to form an element isolation region 83. At this time, the etching is performed to the depth of the interface between the first interconnection 20 and the barrier layer 32.

In the case where such a deep element isolation region 83 is formed, the cross-sectional dimension in the direction substantially perpendicular to the stack direction (Z-axis direction) decreases toward the first interconnection 20 as described above. That is, the cross section of the stacked body increases toward the first interconnection 20. Accordingly, in this embodiment, the cross-sectional dimension is controlled by etching a side wall 84 of the stacked body portion including the first interconnection 20. For example, the control is performed so that the memory layers 44 and the rectifying elements 30 provided for the layers may become substantially equal in cross-sectional dimension in the direction substantially perpendicular to the stack direction.

Figure 16A:
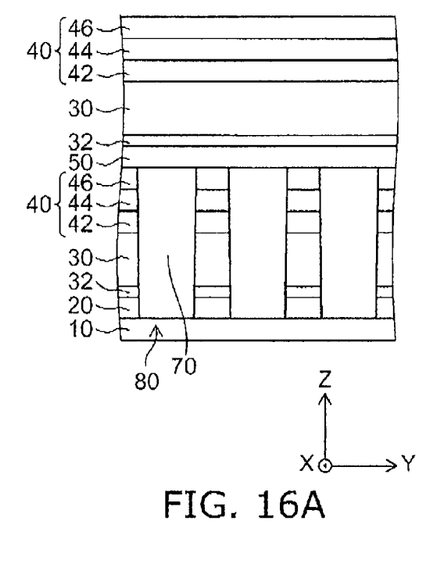
Figure 16B:
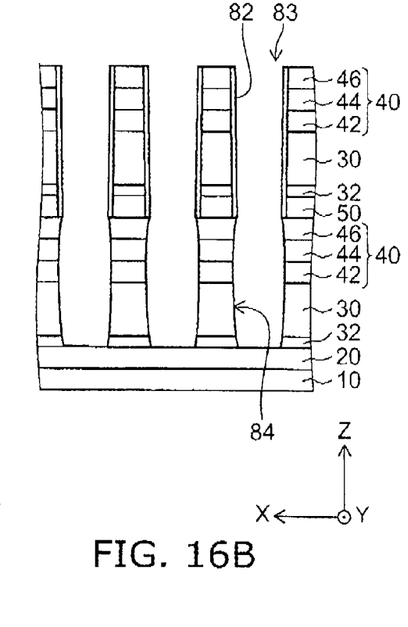

For example, as illustrated in FIG. 16B, the side wall 84 of the stacked body portion including the first interconnection 20 may be etched by using a highly isotropic wet etching method and the like to control the cross-sectional dimension.

In this case, the etching amount of the side wall 84 is determined preferably in view of the cross-sectional dimensions of the memory layer 44 and the rectifying element 30 illustrated in FIG. 4.

For example, in order to achieve low power, the cross-sectional dimension of the memory layer 44 is preferably made small; and in order to reduce the load of the rectifying element 30, the cross-sectional dimension of the rectifying element 30 is preferably made large. Therefore, it is preferable to determine the etching amount of the side wall 84 so as to obtain the cross-sectional dimensions L1 and L2 (see FIG. 4) desirable for both achieving low power and reducing the load of the rectifying element 30.

That is, the method for manufacturing a nonvolatile memory device according to this embodiment is a method for manufacturing a nonvolatile memory device in which memory cells are stacked in a plurality of layers, the memory cell including: the first interconnection 20 extending in the first direction; the second interconnection 50 extending in the second direction nonparallel to the first direction; and the memory layer 44 placed between the first interconnection 20 and the second interconnection 50 and capable of reversibly transitioning between a first state and a second state by a current supplied via the first interconnection 20 and the second interconnection 50, and the method including: stacking at least a layer that forms the first interconnection 20, a layer that forms the memory layer 44, and a layer that forms the second interconnection 50 on the substrate 10 in the third direction substantially perpendicular to the first direction and the second direction to form a stacked body; providing an etching mask having an opening on the stacked body; performing etching of a smaller dimension than the dimension in the third direction of the element isolation region in the third direction via the etching mask; forming a protection layer at least on the side wall face of the etched stacked body; further etching to the dimension in the third direction of the element isolation region; and etching a portion of the side wall face on which the protection layer is not formed to control the size of the cross section parallel to the first and second directions of the element isolation region.

According to the method for manufacturing a nonvolatile memory device according to this embodiment, even in those cases where an element isolation region penetrating through a plurality of layers is formed, the memory layers 44 and the rectifying elements 30 provided for the layers can be made substantially equal in cross-sectional dimension in the direction substantially perpendicular to the stack direction, by etching the side wall 84 of the stacked body portion including the first interconnection 20. Furthermore, the memory layer 44 and the rectifying element 30 that can achieve low power and reduce the load of the rectifying element 30 can be formed. Therefore, a nonvolatile memory device excellent in electrical characteristics can be obtained.

Hereinabove, the embodiments are illustrated. However, the invention is not limited to those descriptions.

One skilled in the art may perform appropriately design modifications on the embodiments described above. Such modifications also are included in the scope of the invention to the extent that the purport of the invention is included.

For example, the shape, dimension, material, arrangement, and the like of components of the nonvolatile memory device 2 and the like are not limited to those illustrated but may be appropriately altered.

Further, components of the embodiments described above may be combined within the extent of feasibility; and combinations of them are included in the scope of the invention to the extent that the purport of the invention is included.

The invention claimed is:

1. A nonvolatile memory device comprising:
a first interconnection extending in a first direction;
a second interconnection extending in a second direction nonparallel to the first direction;
a third interconnection extending in the first direction;
a first memory layer placed between the first interconnection and the second interconnection and reversibly transitioning between a first state and a second state by a current supplied via the first interconnection and the second interconnection;
a first rectifying element provided between the first interconnection and the first memory layer;
a second memory layer placed between the second interconnection and the third interconnection and reversibly transitioning between a first state and a second state by a current supplied via the second interconnection and the third interconnection; and
a second rectifying element provided between the second interconnection and the second memory layer;
a cross section parallel to the first and the second directions of the first memory layer decreasing toward the second interconnection,
a cross section parallel to the first and the second directions of the first rectifying element decreasing toward the second interconnection,
a cross section parallel to the first and the second directions of the second memory layer decreasing toward the third interconnection,
a cross section parallel to the first and the second directions of the second rectifying element decreasing toward the third interconnection,
a cross-sectional dimension changing continuously from the second memory layer to the first rectifying element, and
the cross-sectional dimension decreasing continuously with distance from the first interconnection.

2. The device according to claim 1, wherein an end of the first memory layer on the first interconnection side and an end of the first rectifying element on the second interconnection side are substantially equal in size.

3. The device according to claim 1, wherein the first memory layer is reversibly transitioning at least one of a resistance value, a crystal state, and an amorphous state.

* * * * *